(12) United States Patent
Shimomura et al.

(10) Patent No.: US 10,847,648 B2
(45) Date of Patent: Nov. 24, 2020

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Saya Shimomura, Komatsu Ishikawa (JP); Kenya Kobayashi, Nonoichi Ishikawa (JP)

(73) Assignees: Kabushiki Kaisha Toshiba, Tokyo (JP); Toshiba Electronic Devices & Storage Corporation, Tokyo (JP)

(*) Notice: Subject to any disclaimer, the term of this patent is extended or adjusted under 35 U.S.C. 154(b) by 0 days.

(21) Appl. No.: 16/033,371

(22) Filed: Jul. 12, 2018

(65) Prior Publication Data
US 2019/0252541 A1    Aug. 15, 2019

(30) Foreign Application Priority Data
Feb. 14, 2018 (JP) .................. 2018-024047

(51) Int. Cl.
| H01L 29/78 | (2006.01) |
| H01L 29/40 | (2006.01) |
| H01L 29/06 | (2006.01) |
| H01L 29/10 | (2006.01) |

(52) U.S. Cl.
CPC ...... *H01L 29/7813* (2013.01); *H01L 29/0615* (2013.01); *H01L 29/1095* (2013.01); *H01L 29/407* (2013.01)

(58) Field of Classification Search
None
See application file for complete search history.

(56) References Cited

U.S. PATENT DOCUMENTS

| 7,564,095 | B2 |  | 7/2009 | Urakami et al. |
| 9,530,882 | B1 | * | 12/2016 | Hsieh ................ H01L 29/66734 |
| 9,634,130 | B2 | * | 4/2017 | Onozawa ........... H01L 29/4236 |
| 9,761,582 | B2 | * | 9/2017 | Gejo .................. H01L 29/0834 |
| 10,297,593 | B2 | * | 5/2019 | Gejo .................. H01L 27/0727 |

(Continued)

FOREIGN PATENT DOCUMENTS

| JP | 2010-010263 A | 1/2010 |
| JP | 4830360 B2 | 12/2011 |

(Continued)

*Primary Examiner* — Nishath Yasmeen
(74) *Attorney, Agent, or Firm* — White & Case LLP

(57) ABSTRACT

According to one embodiment, a semiconductor device includes first and second electrodes, first, second, and third semiconductor regions, a gate electrode, first, and second conductive parts. The first semiconductor region includes a first region and a second region. The second semiconductor region is provided on the first region. The third semiconductor region is provided on the second semiconductor region. The second electrode is provided on the third semiconductor region. The gate electrode opposes the second semiconductor region in a second direction. The first conductive part is provided on the second region and is provided in a plurality in a third direction. The first conductive parts are arranged with the gate electrode in the second direction. The second conductive part is provided on the second region, and arranged with the gate electrode and the first conductive parts in the third direction.

10 Claims, 16 Drawing Sheets

(56) References Cited

U.S. PATENT DOCUMENTS

| | | | |
|---|---|---|---|
| 2010/0052044 A1* | 3/2010 | Hirler | ............ H01L 29/7813 |
| | | | 257/328 |
| 2012/0043581 A1* | 2/2012 | Koyama | ............ H01L 29/8613 |
| | | | 257/140 |
| 2017/0317207 A1* | 11/2017 | Hsieh | ............ H01L 21/3086 |
| 2018/0076307 A1 | 3/2018 | Shimomura et al. | |

FOREIGN PATENT DOCUMENTS

| | | |
|---|---|---|
| JP | 5422930 B2 | 2/2014 |
| JP | 2018-046201 A | 3/2018 |

* cited by examiner

US 10,847,648 B2

SEMICONDUCTOR DEVICE

CROSS-REFERENCE TO RELATED APPLICATIONS

This application is based upon and claims the benefit of priority from Japanese Patent Application No. 2018-024047, filed on Feb. 14, 2018; the entire contents of which are incorporated herein by reference.

FIELD

Embodiments described herein relate generally to a semiconductor device.

BACKGROUND

A semiconductor device such as MOSFET (Metal Oxide Semiconductor Field Effect Transistor) is used as a switching device. MOSFET includes a parasitic bipolar transistor. If this parasitic transistor operates, there is a possibility that the semiconductor device is destroyed. Therefore, it is desired that the parasitic transistor is difficult to operate.

DETAILED DESCRIPTION

Figure 1:
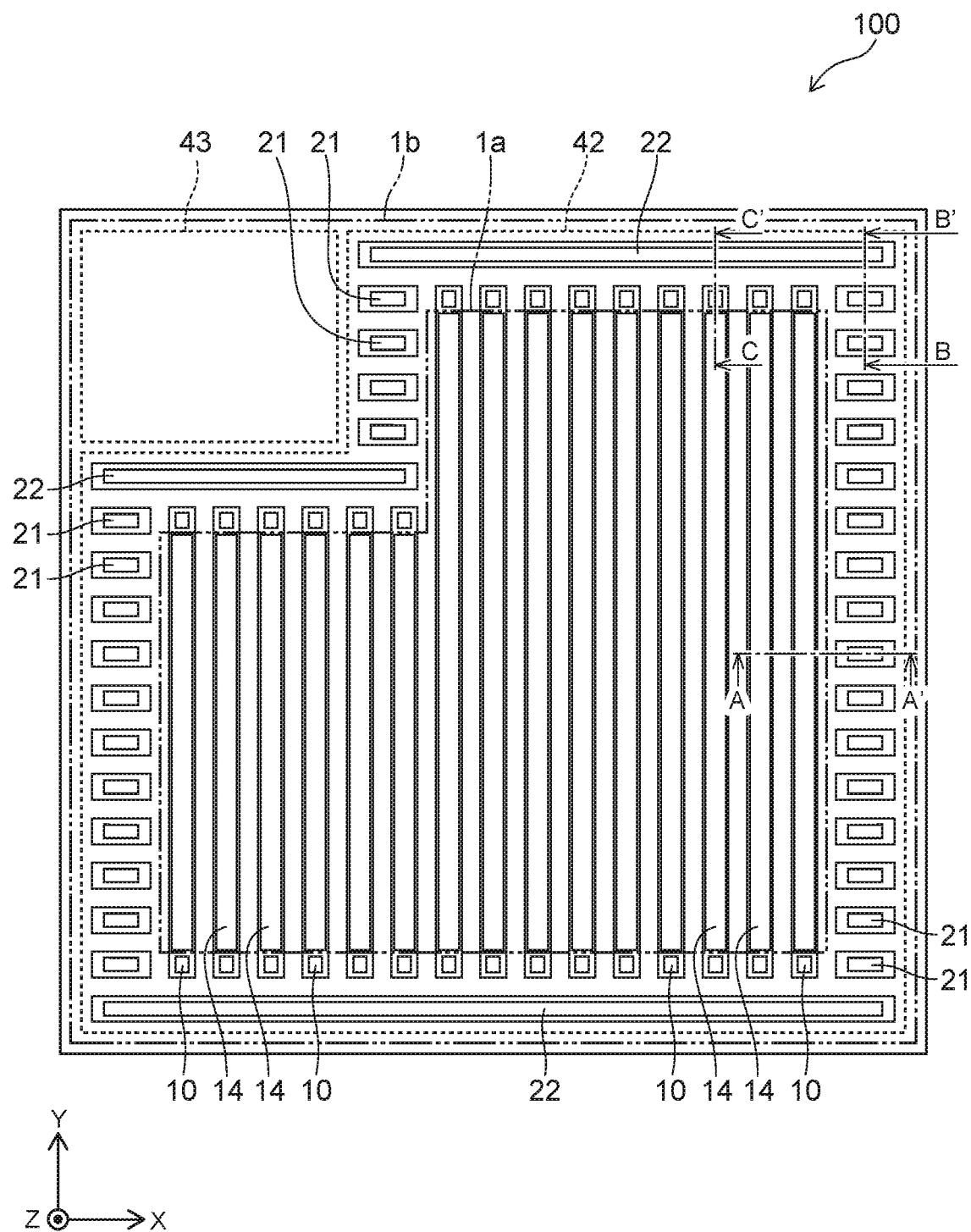
FIG. 1 is a plan view showing a semiconductor device according to a first embodiment.

According to one embodiment, a semiconductor device includes a first electrode, a first semiconductor region, a second semiconductor region, a third semiconductor region, a second electrode, a gate electrode, a first conductive part, and a second conductive part. The first semiconductor region is provided on the first electrode. The first semiconductor region includes a first region and a second region surrounding the first region. The first semiconductor region is of a first conductivity type. The second semiconductor region is provided on the first region. The second semiconductor region is of a second conductivity type. The third semiconductor region is provided on the second semiconductor region. The third semiconductor region is of the first conductivity type. The second electrode is provided on the third semiconductor region. The second electrode is electrically connected to the second semiconductor region and the third semiconductor region. The gate electrode opposes the second semiconductor region via a gate insulating part in a second direction perpendicular to a first direction from the first region toward the second semiconductor region. The first conductive part is provided on the second region via a first insulating part and electrically connected to the second electrode or the gate electrode. The first conductive part is provided in a plurality in a third direction perpendicular to the first direction and the second direction. The plurality of first conductive parts are separated one another. The first conductive parts are arranged with the gate electrode in the second direction. The second conductive part is electrically connected to the second electrode or the gate electrode. The second conductive part is provided on the second region via a second insulating part. The second conductive part is arranged with the gate electrode and the first conductive parts in the third direction.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described thereinabove are marked with like reference numerals, and a detailed description is omitted as appropriate.

In the following descriptions and drawings, notations of $n^+$, $n$, $n^-$ and $p^+$, $p$, $p^-$ represent relative height of an impurity concentration in conductive types. That is, the notation with "+" shows a relatively higher impurity concentration than an impurity concentration for the notation without any of "+" and "−". The notation with "−" shows a relatively lower impurity concentration than the impurity concentration for the notation without any of them.

The embodiments described below may be implemented by reversing the p-type and the n-type of the semiconductor regions.

First Embodiment

FIG. 1 is a plan view showing a semiconductor device according to a first embodiment.

Figure 2:
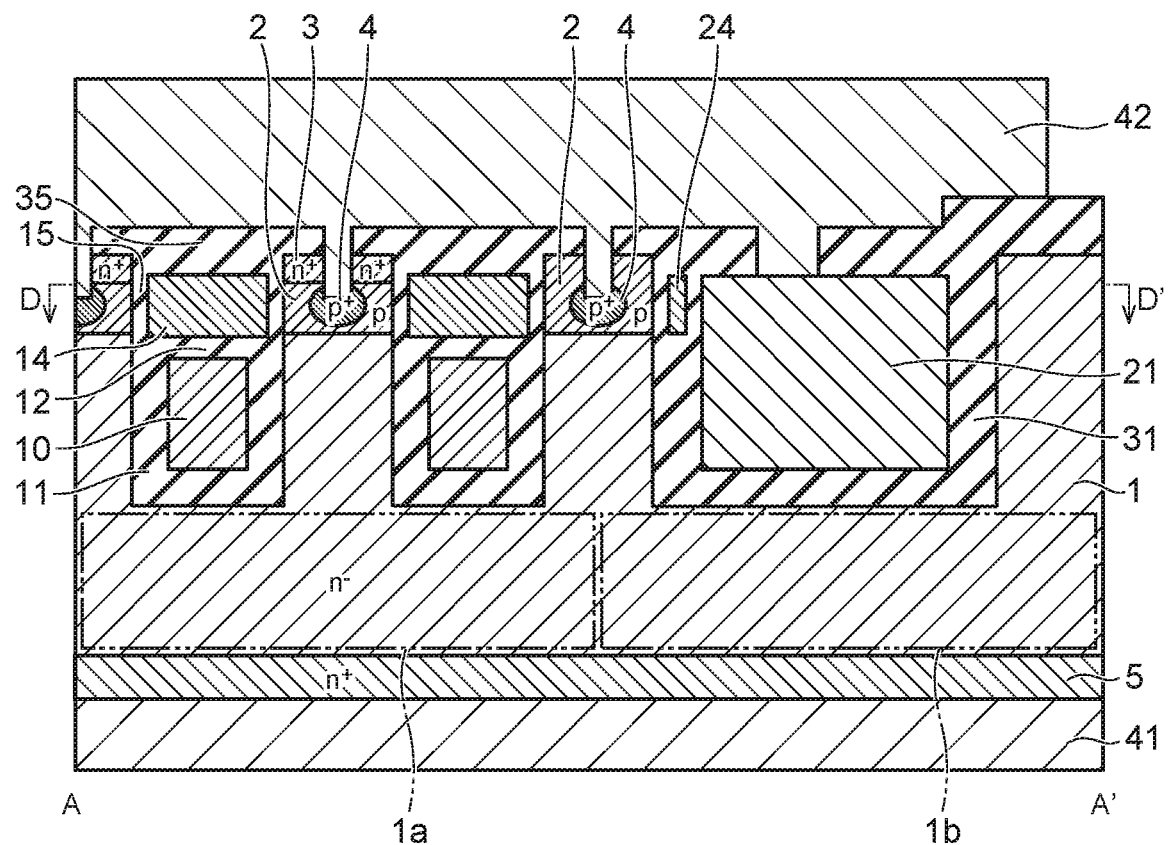
FIG. 2 is an A-A' cross-sectional view of FIG. 1.
Figure 2:
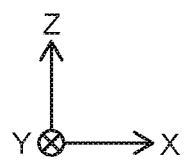

FIG. 2 is an A-A' cross-sectional view of FIG. 1.

Figure 3A:
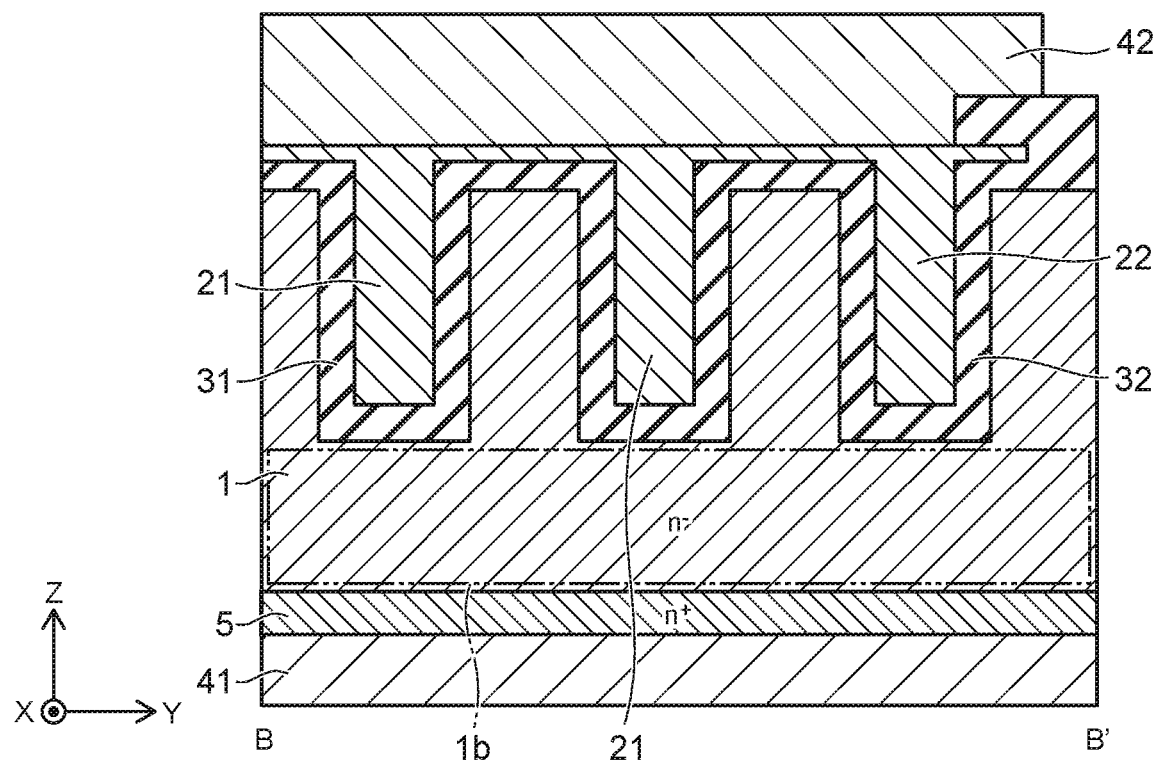
FIGS. 3A and 3B are a B-B' cross-sectional view and a C-C' cross-sectional view of FIG. 1.
Figure 3B:
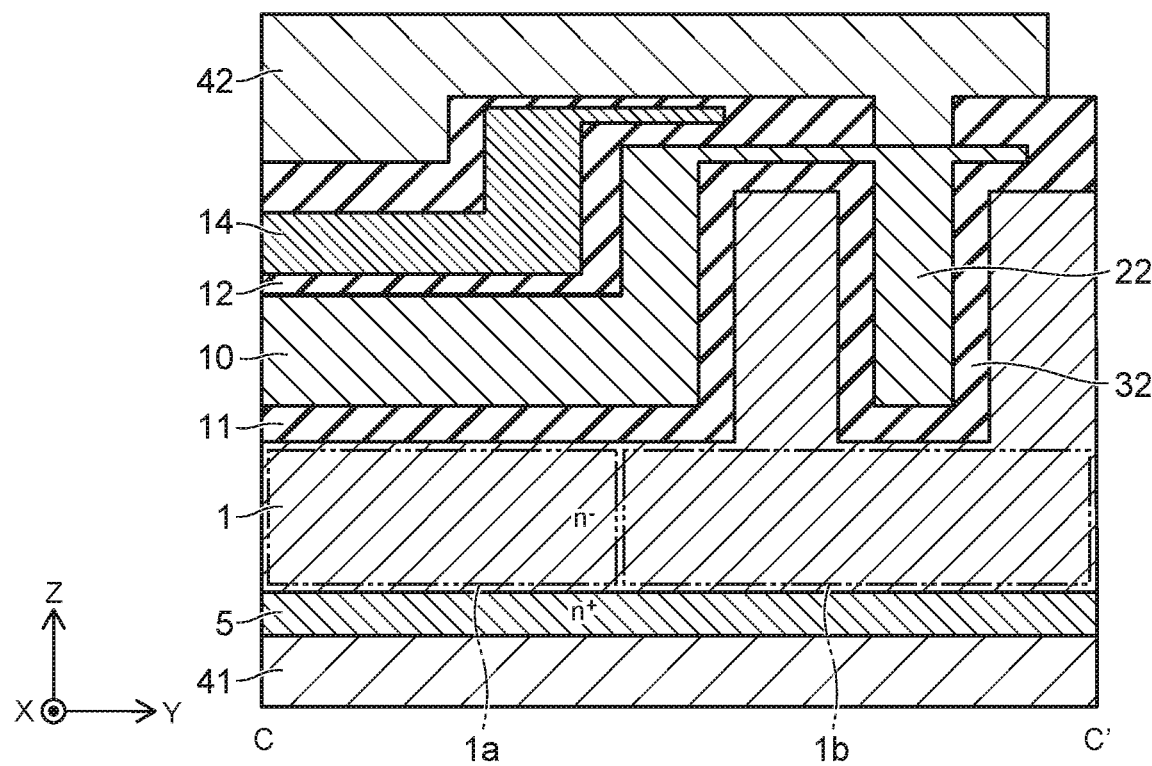

FIGS. 3A and 3B are a B-B' cross-sectional view and a C-C' cross-sectional view of FIG. 1.

FIG. 1 shows a cut plane at a position of a D-D' line of FIG. 2. The respective semiconductor regions are omitted in FIG. 1.

A semiconductor device 100 is, for example, MOSFET. As shown in FIG. 1 to FIG. 3B, the semiconductor device 100 includes an n⁻-type (first conductivity type) semiconductor region 1 (first semiconductor region), a p-type (second conductivity type) base region 2 (second semiconductor region), an n⁻-type source region 3 (third semiconductor region), a p⁺-type contact region 4 (fourth semiconductor region), an n⁺-type drain region 5 (fifth semiconductor region), a field plate electrode (hereinafter, referred to as FP electrode) 10 a gate electrode 14, a first conductive part 21, a second conductive part 22, a drain electrode 41 (first electrode), a source electrode 42 (second electrode), and a gate pad 43 (third electrode).

An XYZ orthogonal coordinate system is used in the description of the embodiment. A direction from a first region 1a of the n⁻-type semiconductor region 1 toward the p-type base region 2 is taken as a Z-direction (first direction). Two directions perpendicular to the Z-direction and orthogonal each other are taken as an X-direction (second direction) and a Y-direction (third direction). For description, a direction from the first region 1a toward the p-type base region 2 is referred to as "upward", and the opposite direction is referred to as "downward". These directions are based on a positional relationship between the first region 1a and the p-type base region 2, and are unrelated to a direction of gravity.

FIG. 1 shows the source electrode 42 and the gate pad 43 by broken lines. As shown in FIG. 1, the source electrode 42 and the gate pad 43 are provided on an upper surface of the semiconductor device 100, and separated each other. The FP electrode 10, the gate electrode 14, the first conductive part 21, and the second conductive part 22 are provided under the source electrode 42.

As shown in FIG. 2, the drain electrode 41 is provided on a lower surface of the semiconductor device 100. The n⁺-type drain region 5 is provided on the drain electrode 41 and electrically connected to the drain electrode 41. The n⁻-type semiconductor region 1 is provided on the n⁺-type drain region 5. The n⁻-type semiconductor region 1 includes the first region 1a and a second region 1b surrounding the first region 1a. A direction from the first region 1a toward the second region 1b is perpendicular to the Z-direction. The p-type base region 2 is provided on the first region 1a. The n⁻-type source region 3 and the p⁺-type contact region 4 are provided on the p-type base region 2.

The FP electrode 10 is provided on the first region 1a via an insulating part 11. The gate electrode 14 is provided on the FP electrode 10 via an insulating part 12. The gate electrode 14 opposes at least a portion of the n⁻-type semiconductor region 1, the p-type base region 2, or the n⁺-type source region 3 via a gate insulating part 15 in the X-direction. An insulating part 35 is provided on the gate electrode 14. The gate electrode 14 is electrically connected to the gate pad 43.

A portion of the source electrode 42 is provided in the insulating part 35 and is electrically connected to the n⁺-type source region 3 and the p⁺-type contact region 4. In the example shown in FIG. 2, the p⁺-type contact region 4 is positioned below the n⁺-type source region 3. The n⁺-type source region 3 is arranged with a portion of the source electrode 42 in the X-direction. A potential of the source electrode 42 is, for example, set to a ground. The gate electrode 14 and the source electrode 42 are electrically isolated by the insulating part 35. The FP electrode 10 is electrically connected to the source electrode 42 or the gate electrode 14 (gate pad 43).

Each of the p-type base region 2, the n⁺-type source region 3, the p⁺-type contact region 4, the FP electrode 10, and the gate electrode 14 is provided multiply in the X-direction on the first region 1a, and extends in the Y-direction.

As shown in FIG. 1, the first conductive part 21 is provided multiply in the Y-direction. The multiple first conductive parts 21 are separated one another. The multiple first conductive parts 21 are arranged with the gate electrodes 14 in the X-direction. In the example of FIG. 1, the first conductive part 21 is further provided multiply in the X-direction. The multiple gate electrodes 14 are positioned between a portion of the multiple first conductive parts 21 and another portion of the multiple first conductive parts 21 in the X-direction.

The second conductive part 22 extends in the X-direction. The second conductive part 22 is arranged with the multiple gate electrodes 14 and the multiple first conductive parts 21. In the example of FIG. 1, the second conductive part 22 is provided multiply in the Y-direction. The multiple gate electrodes 14 and the multiple first conductive parts 21 are positioned between the second conductive part 22 and the other second conductive part 22.

The multiple first conductive parts 21 and the multiple second conductive parts 22 are provided only under the source electrode 42 in order not to be positioned under the gate pad 43, for example.

As shown in FIG. 2, the first conductive part 21 is provided on the second region 1b via the first insulating part 31. The first conductive part 21 opposes a portion of the n⁻-type semiconductor region 1 via the first insulating part 31 in the X-direction and the Y-direction. The first conductive part 21 is, for example, electrically connected to the source electrode 42. Alternatively, the first conductive part 21 may be electrically connected to the gate electrode 14 and the gate pad 43.

For example, a fourth conductive part 24 is provided in the first insulating part 31 between the first conductive part 21 and the p-type base region 2. The fourth conductive part 24 is separated from the first conductive part 21 in the X-direction. For example, a length in the X-direction of the fourth conductive part 24 is shorter than a length in the X-direction of the first conductive part 21. A length in the Z-direction of the fourth conductive part 24 is shorter than a length in the Z-direction of the first conductive part 21. A potential of the fourth conductive part 24 is, for example, floating. Alternatively, the fourth conductive part 24 may be electrically connected to the source electrode 42.

As shown in FIG. 3A and FIG. 3B, the second conductive part 22 is provided on the second region 1b via a second insulating part 32. The second conductive part 22 opposes a portion of the n⁻-type semiconductor region 1 via the second insulating part 32 in the X-direction and the Y-direction. The second conductive part 22 is, for example, electrically connected to the source electrode 42. Alternatively, the second conductive part 22 may be electrically connected to the gate electrode 14 and the gate pad 43.

For example, as shown in FIG. 3A and FIG. 3B, the first conductive part 21 and the second conductive part 22 are continuously connected. The first insulating part 31 and the second insulating part 32 are continuously connected.

On example of materials of constituent components of the semiconductor device 100 will be described.

The n⁺-type semiconductor region 1, the p-type base region 2, the n⁺-type source region 3, the p⁺-type contact region 4, and the n⁺-type drain region 5 include silicon, silicon carbide, gallium nitride, or gallium arsenide as a semiconductor material. In the case where silicon is used as the semiconductor material, arsenic, phosphorous, or antimony can be used as an n-type impurity. Boron can be used as a p-type impurity.

The FP electrode 10, the gate electrode 14, the first conductive part 21, and the second conductive part 22 include a conductive material such as polysilicon.

The insulating part 11, the insulating part 12, the gate insulating part 15, the first insulating part 31, and the second insulating part 32 include an insulating material such as silicon oxide.

The drain electrode 41, the source electrode 42, and the gate pad 43 include a metal such as aluminum.

The operation of the semiconductor device 100 will be described.

If a voltage not less than a threshold value is applied to the gate electrode 14 in a state in which a positive voltage to the source electrode 42 is applied to the drain electrode 41, a channel (inversion layer) is formed at the gate insulating part 15 vicinity of the p-type base region 2, and the semiconductor device 100 turned into an ON state. Electrons flow from the source electrode 42 to the drain electrode 41 through this channel. After that, when the voltage applied to the gate electrode 14 becomes lower than the threshold value, the channel in the p-type base region 2 disappears, and the semiconductor device 100 turns into an OFF state.

On example of a method for manufacturing the semiconductor device 100 will be described.

FIG. 4A to FIG. 6D are process cross-sectional views showing a manufacturing process of the semiconductor device according to the first embodiment.

FIG. 4A to FIG. 6D show the manufacturing process of a portion corresponding to A-A' cross section of FIG. 1.

Figure 4A:
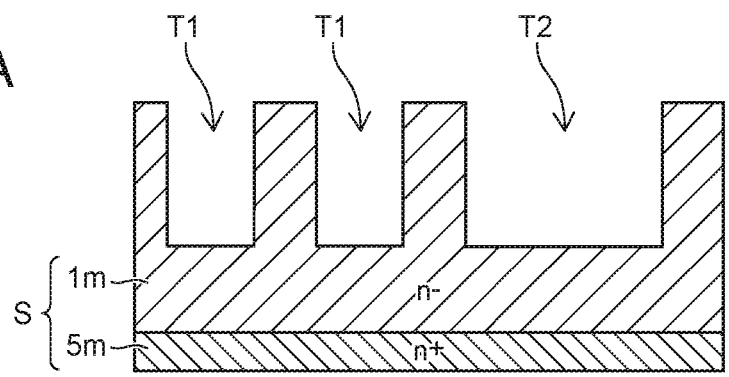
FIGS. 4A to 4D are process cross-sectional views showing a manufacturing process of the semiconductor device according to the first embodiment.

Firstly, a semiconductor substrate S including an $n^+$-type semiconductor region 5m and an $n^-$-type semiconductor region 1m is prepared. The $n^-$-type semiconductor region 1m is provided on the $n^+$-type semiconductor region 5m. Trenches T1 and T2 are formed on an upper surface of the $n^-$-type semiconductor region 1m by using a photolithography method and an RIE (Reactive Ion Etching) method as shown in FIG. 4A. The trench T1 is formed multiply in the X-direction. The respective trenches T1 extend in the Y-direction. The trench T2 is formed multiply in the Y-direction. A dimension in the X-direction of the trench T2 is longer than a dimension in the X-direction of the trench T1. The trench T1 is a trench for forming the FP electrode 10 and the gate electrode 14. The trench T2 is a trench for forming the first conductive part 21. In addition, in this process, a not-shown trench for forming the second conductive part 22 is formed.

Figure 4B:
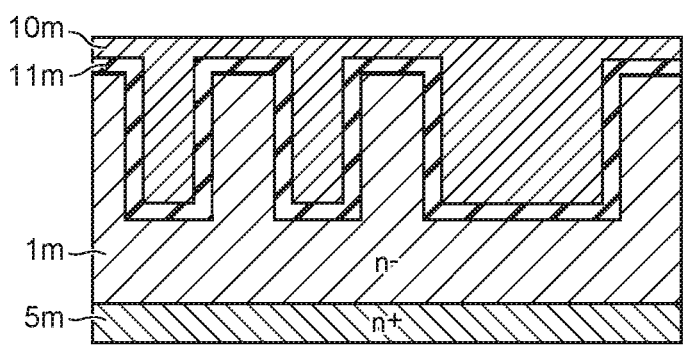

The semiconductor substrate S is thermally oxidized, and an insulating layer 11m is formed along a surface of the $n^-$-type semiconductor region 1m. As shown in FIG. 4B, a conductive layer 10m with which the trenches T1 and T2 are filled is formed on the insulating layer 11m by using a CVD (Chemical Vapor Deposition) method.

Figure 4C:
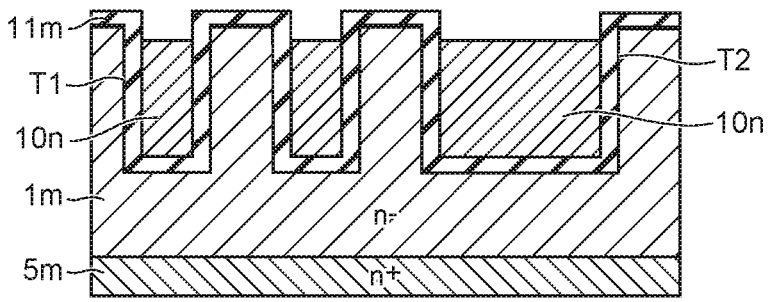
Figure 4D:
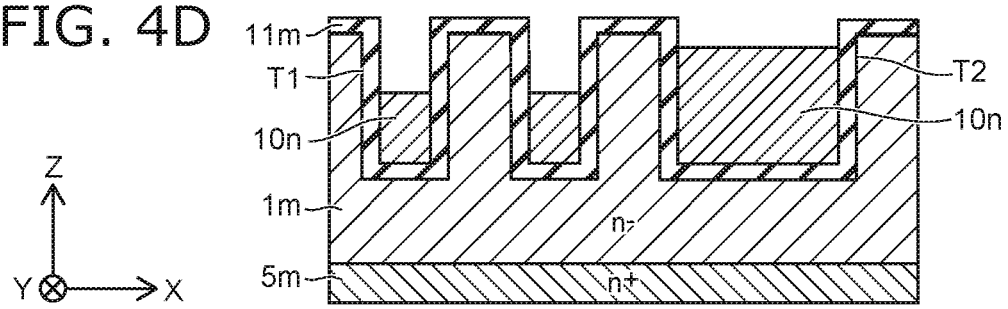

As shown in FIG. 4C, a portion of the conductive layer 10m is removed and thus multiple conductive layers 10n separated one another are formed. The conductive layer 10n formed in the trench T2 is covered with a not shown mask. As shown in FIG. 4D, a portion of the conductive layer 10n formed in the trench T1 is removed. The conductive layer 10n remained in the trench T1 corresponds to the FP electrode 10. The conductive layer 10n remained in the trench T2 corresponds to the first conductive part 21.

Figure 5A:
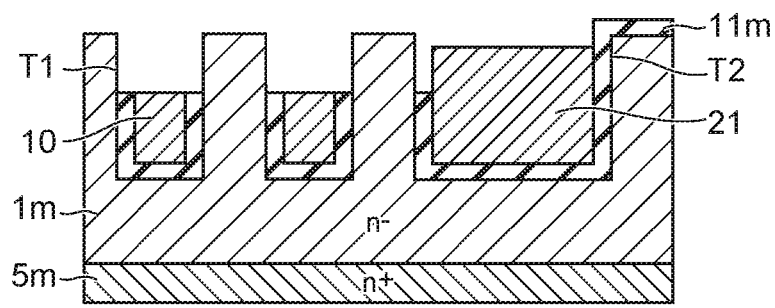
FIGS. 5A to 5D are process cross-sectional views showing a manufacturing process of the semiconductor device according to the first embodiment.

Outer circumference including the trench T2 of the semiconductor substrate S is covered with a not shown mask. As shown in FIG. 5A, a portion of the insulating layer 11m is removed by wet etching. Thereby, a portion of an inner surface of the trench T1 and a portion of an inner surface of the trench T2 are exposed. The semiconductor substrate S is thermally oxidized, and an insulating part 15m is formed on the inner surface of the trench T1, the inner surface of the trench T2, and a surface of the first conductive part 21. The insulating part 15m is thinner than the insulating layer 11m. An insulating layer 12m is formed on an upper surface of the FP electrode 10.

Figure 5B:
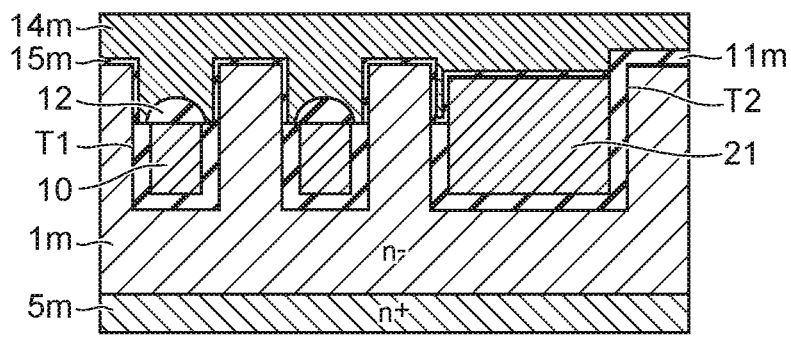
Figure 5C:
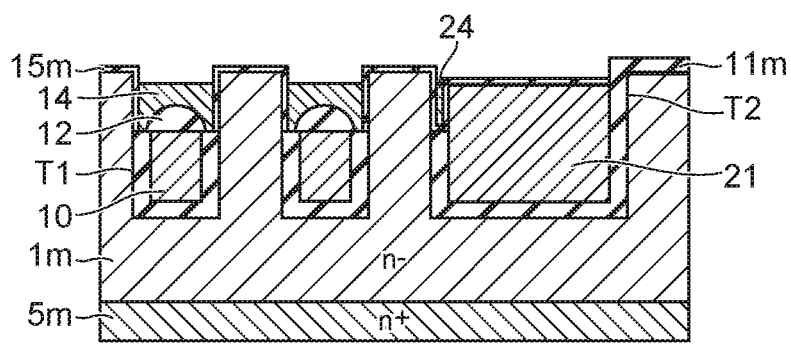

As shown in FIG. 5B, a conductive layer 14m with which the trenches T1 and T2 are filled is formed on the insulating part 15m. A portion of the conductive layer 14m is removed by using a CDE (Chemical Dry Etching) method or the RIE method. Thereby, as shown in FIG. 5C, multiple conductive layers are formed to be provided in the trench T1 and the trench T2, respectively. The conductive layer formed in the trench T1 corresponds to the gate electrode 14. The conductive layer formed in the trench T2 corresponds to the fourth conductive part 24.

Figure 5D:
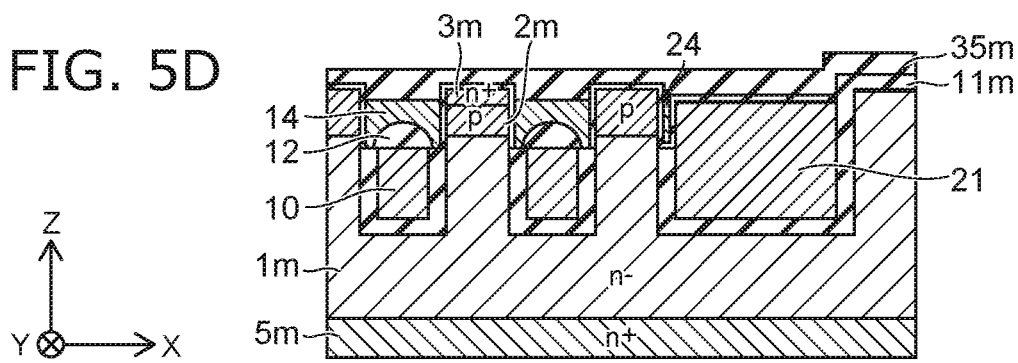

The p-type impurity is ion-implanted between the trenches T1 and between the trenches T1 and T2, and a p-type semiconductor region 2m is formed. The n-type impurity is ion-implanted onto a surface of the p-type semiconductor region 2m between the trenches T1, and an $n'^-$-type semiconductor region 3m is formed. As shown in FIG. 5D, an insulating layer 35m covering the gate electrode 14 and the fourth conductive part 24 is formed.

Figure 6A:
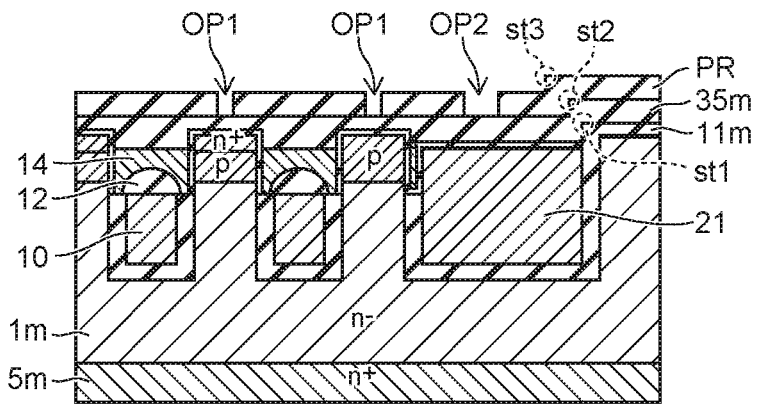
FIGS. 6A to 6D are process cross-sectional views showing a manufacturing process of the semiconductor device according to the first embodiment.

A photoresist PR is formed on the insulating layer 35m. As shown in FIG. 6A, multiple openings OP1 and an opening OP2 are formed in the photoresist PR. A portion of the insulating layer 35m is exposed through the multiple openings OP1 and the opening OP2. The multiple openings OP1 are positioned immediately above the multiple p-type semiconductor region 2m, respectively. The opening OP2 is positioned immediately above the first conductive part 21.

Figure 6B:
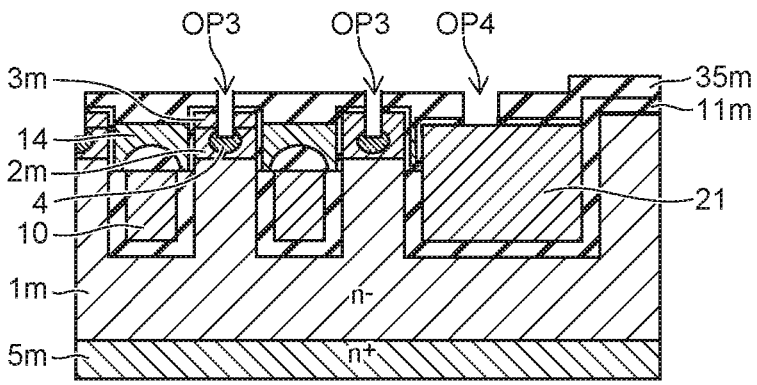

Multiple openings OP3 and an opening OP4 are formed by using the photoresist PR as a mask. The respective openings OP3 pierce the insulating layer 35m, the insulating part 15m, and the $n^+$-type semiconductor region 3m, and reach the p-type semiconductor region 2m. The opening OP4 pierces the insulating layer 35m and the insulating part 15m. The photoresist PR is removed, and the p-type impurity is ion-implanted to a bottom of the opening OP3. Thereby, as shown in FIG. 6B, the $p^+$-type contact 4 is formed. The p-type semiconductor region 2m other than the $p^+$-type contact region 4 corresponds to the p-type base region 2. The $n^+$-type semiconductor region 3m corresponds to the $n^+$-type source region 3.

Figure 6C:
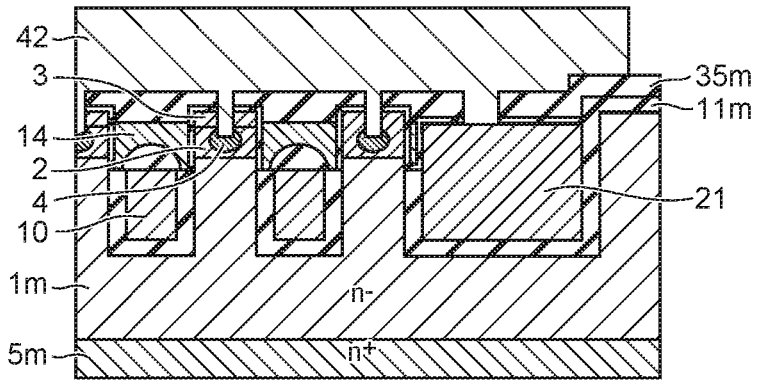
Figure 6D:
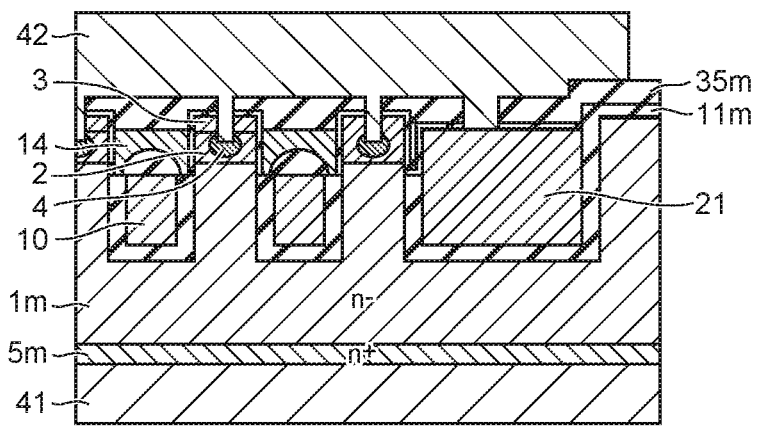

As shown in FIG. 6C, a metal layer is formed on the insulating layer 35 by using a sputtering method. The multiple openings OP3 and the opening OP4 are filled with this metal layer. The source electrode 42 and the gate pad 43 are formed by patterning this metal layer. A lower surface of the $n^+$-type semiconductor region 5m is ground until the $n^+$-type semiconductor region 5m has a predetermined thickness. As shown in FIG. 6D, a metal material is deposited on the ground lower surface of the $n^+$-type semiconductor region 5m by using the sputtering method to form the drain electrode 41. Through the above processes, the semiconductor device 100 shown in FIG. 1 to FIG. 3B is manufactured.

With respect to the trenches T1 and T2 formed by the process shown in FIG. 4A, a dimension in the X-direction of the trench T2 is longer than a dimension in the X-direction of the trench T1. Thereby, as shown in FIG. 6A, a first distance in the X-direction between a step st1 and the p-type semiconductor region 2m can be long. The step st1 is formed between an upper surface of the insulating layer 11m and an upper surface of the first conductive part 21. When the first distance becomes long, a second distance in the X-direction between a step st2 formed on an upper surface of the insulating layer 35m and p-type semiconductor region 2m becomes longer. When the step st2 is present, a step st3 is generated on a surface of the photoresist PR. When the second distance becomes long, a position of the step st3 can be shifted to the outer circumference side of the semiconductor substrate S from a position where the opening OP2 is formed.

A thickness of a portion where the step st3 of the photoresist PR is present is larger than a thickness of other portion of the photoresist PR such as on the gate electrode 14. Therefore, if the position of the step st3 overlaps the position of the opening OP2, the photoresist PR is not removed sufficiently when forming the opening OP2, and there is a possibility that the insulating layer 35m is not exposed. In the case where the insulating layer 35m is not exposed through the opening OP2, the opening OP4 is not formed adequately. As a result, there is a possibility that the first conductive part 21 is not connected to the source electrode 42. As described above, the opening OP4 can be formed adequately by shifting the position of the step st3 from the position where the opening OP2 is formed.

The effect of the first embodiment will be described with reference to FIG. 7A to FIG. 9.

Figure 7A:
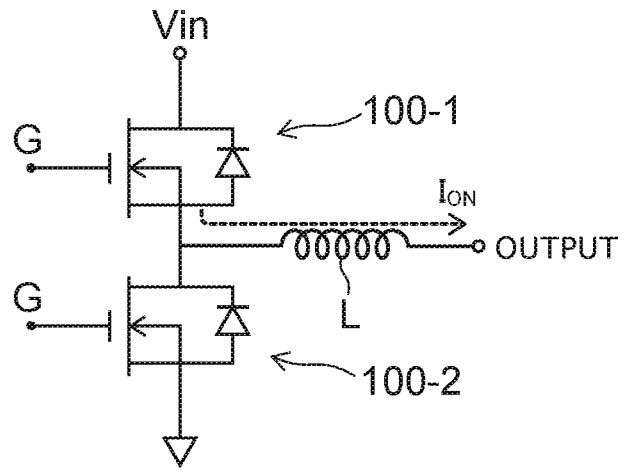
FIGS. 7A to 7C are circuit diagrams illustrating electric circuits to which the semiconductor device according to the first embodiment is connected.
Figure 7B:
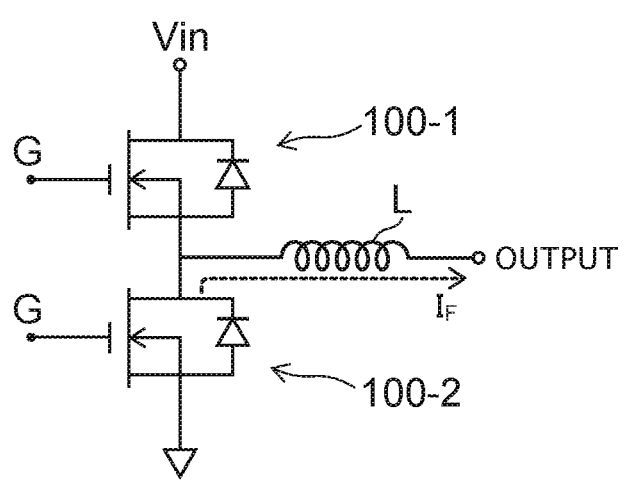
Figure 7C:
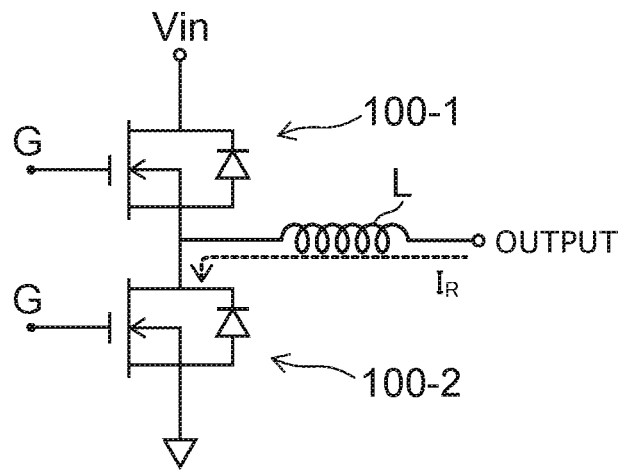

FIGS. 7A to 7C are circuit diagrams illustrating electric circuits in which the semiconductor device according to the first embodiment is connected.

Figure 8:
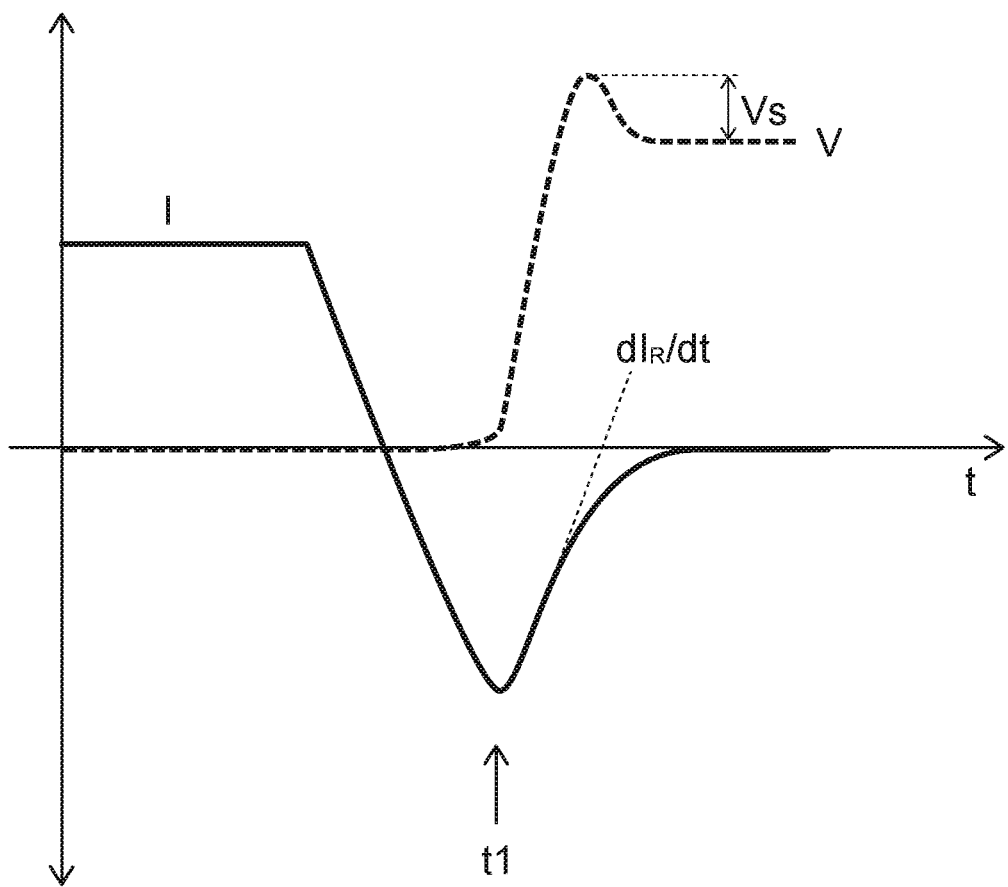
FIG. 8 is a graph showing a current and a voltage in the semiconductor device in the electric circuit shown in FIG. 7.

FIG. 8 is a graph showing a current and a voltage in the semiconductor device in the electric circuit shown in FIG. 7.

Figure 9:
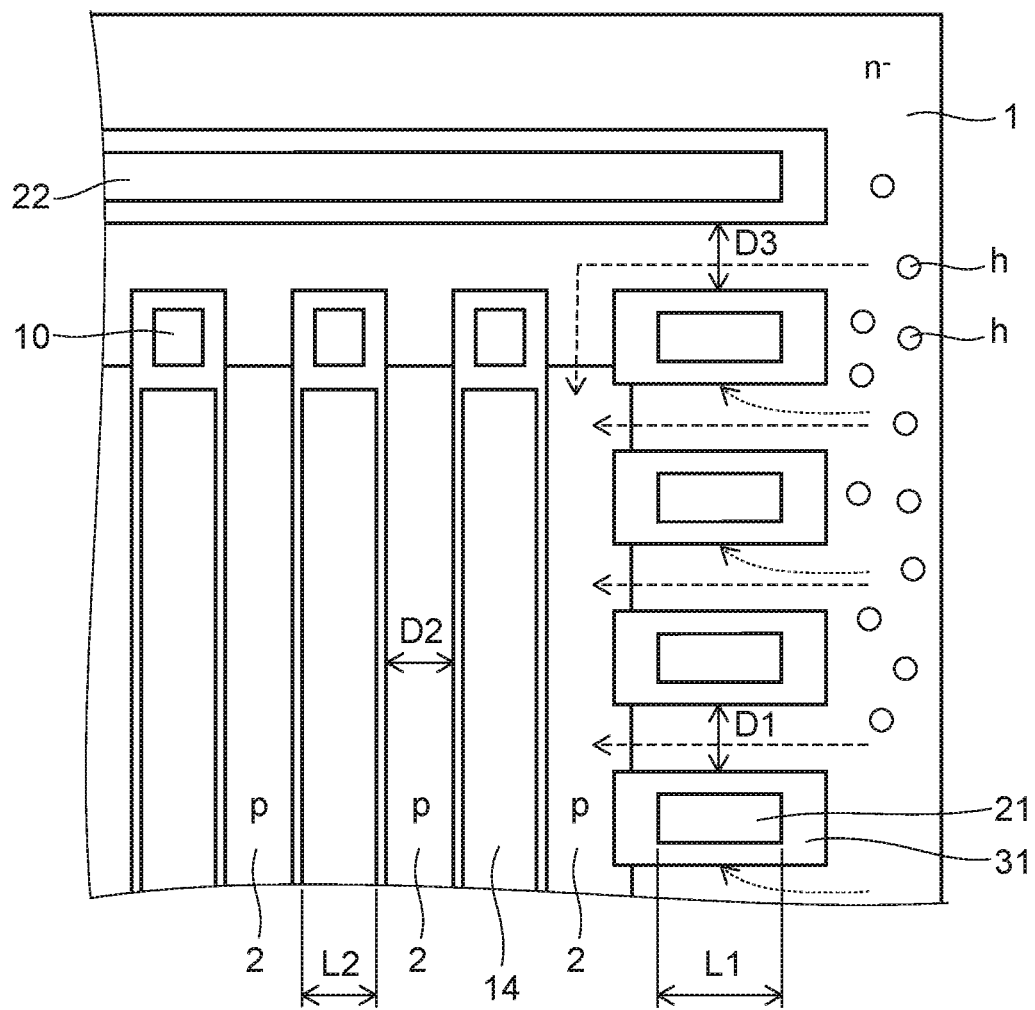
FIG. 9 is a plan view schematically showing a flow of a hole in the semiconductor device according to the first embodiment.

FIG. 9 is a plan view schematically showing a flow of a hole in the semiconductor device according to the first embodiment.

Semiconductor regions other than the n⁻-type semiconductor region 1 and the p-type base region 2 are omitted in FIG. 9.

In the examples shown in FIG. 7A to FIG. 7C, two semiconductor devices 100-1 and 100-2 according to the embodiment are used, and a half bridge circuit is formed. FIG. 7A shows an aspect in which the semiconductor device 100-1 is in an ON state and the semiconductor device 100-2 is in an OFF state. In the semiconductor device 100-1, an ON current $I_{ON}$ flows.

When the semiconductor device 100-1 is turned off in a state shown in FIG. 7A, an induced electro motive force due to an inductance L is generated. Thereby, as shown in FIG. 7B, a forward current $I_F$ flows in a diode composed of the n⁻-type semiconductor region 1 and the p-type base region 2 of the semiconductor device 100-2. At this time, a hole is injected from the source electrode 42 to the n⁻-type semiconductor region 1, and an electron is injected from the drain electrode 14 to the n⁻-type semiconductor region 1.

When the forward current runs out in the diode of the semiconductor device 100-2, a carrier stored inside the semiconductor device 100-2 is discharged. At this time, the hole stored in the n⁻-type semiconductor region 1 is discharged to the source electrode 42. The electron is discharged to the drain electrode 41. The carrier is discharged from the semiconductor device 100-2, and thus as shown in FIG. 7C, a reverse recovery current $I_R$ flows in the semiconductor device 100-2. The reverse recovery current $I_R$ flows from the drain electrode 41 toward the source electrode 42.

In FIG. 8, a solid line represents a current flowing in the semiconductor device 100-2. A broken line represents a voltage of the drain electrode 41 to the source electrode 42. The horizontal axis represents a time, and the vertical axis represents a current value. The current value is represented by taking a direction from the drain electrode 41 toward the source electrode 42 as positive.

As shown in FIG. 8, if the forward current runs out at a timing t1, thereafter, the reverse recovery current starts to flow. The voltage of the drain electrode 41 to the source electrode 42 of the semiconductor device 100-2 starts to increase. At this time, a serge voltage Vs is generated in the voltage V depending on $dI_R/dt$ of a slope of the reverse recovery current decrease. If the $dI_R/dt$ is large, the serge voltage Vs also increases. If the serge voltage Vs is large, a parasitic NPN transistor composed of the n⁺-type source region 3, the p-type base region 3, and the n⁻-type semiconductor region 1 is easy to operate. If the parasitic NPN transistor operates, a large current flows in the semiconductor device, and there is a possibility that the semiconductor device is destroyed. Therefore, the $dI_R/dt$ is desired to be small.

A portion of the injected carrier at the diode operation is stored in the outer circumference of the type semiconductor region 1 as well. The hole stored in the outer circumference of the n⁻-type semiconductor region 1 moves to the near p-type base region 2 at the reverse recovery operation and is discharged to the source electrode 42. Therefore, more holes than holes in other portion flow in the p-type base region 2 provided on the outer circumference. Therefore, the potential of the p-type base region 2 is easy to rise, and the parasitic NPN transistor is more easily operated.

With respect to this problem, in the semiconductor device 100, the multiple first conductive parts 21 are provided on the second region 1b of the n⁻-type semiconductor region 1. The multiple first conductive parts 21 are separated one another. The multiple first conductive parts 21 are electrically connected to the source electrode 42 or the gate electrode 14 (gate pad 43). That is, when the semiconductor device 100 is in the OFF state, the potential of the first conductive part 21 is negative to the hole.

According to this configuration, a portion of the holes h stored in the outer circumference of the n⁻-type semiconductor region 1 passes between the first conductive parts 21 and flows to the p-base base region 2 as shown by a broken line arrow of FIG. 9. Another portion of the holes h is trapped in the vicinity of the first insulating part 31 as shown by a dotted line arrow. The trapped holes h flow to the p-type base region 2 with taking a long time in comparison with the non-trapped holes h.

In this way, the multiple first conductive parts 21 separated one another are provided, and thus variations in time until the holes h arrive at the p-type base region 2 can be large. As a result, the $dI_R/dt$ shown in FIG. 8 can be small, and the possibility that the semiconductor device is destroyed by the operation of the parasitic NPN transistor can be reduced.

As shown in FIG. 9, a length L1 in the X-direction of the first conductive part 21 is desired to be longer than a length L2 in the X-direction of the gate electrode 14. The length L1 is long, and thus the holes h are easily trapped in the vicinity of the first insulating part 31, and the $dI_R/dt$ can be further small.

A distance D1 in the X-direction between the first insulating parts 31 is desired to be the same as a distance D2 in the X-direction between the gate insulating parts 15 or to be shorter than the distance D2. The distance D1 is, for example, the same as a length in the Y-direction of a portion between the first insulating parts 31 of the n⁻-type semiconductor region 1. The distance D2 is, for example, the same as a length in the X-direction of a portion between the gate insulating parts 15 of the n⁻-type semiconductor region 1. The distance D2 is, for example, the same as a length in the X-direction of the p-type base region 2 between the gate insulating parts 15.

For example, a thickness of the first insulating part 31 is larger than a thickness of the gate insulating part 15. In such a case, when the semiconductor device 100 is turned off, in the n⁻-type semiconductor region 1 in the vicinity of the first insulating part 31, a depletion layer is hard to broaden more than in the n⁻-type semiconductor region 1 in the vicinity of the gate electrode 14 and the FP electrode 10. If the distance D1 is long in the configuration of the multiple first conductive parts 21 separated one another, the n⁻-type semiconductor region 1 between the first insulating parts 31 is hard to be depleted. As a result, there is a possibility that a breakdown voltage of the semiconductor device 100 is decreased.

In order to facilitate depletion of the n⁻-type semiconductor region 1 between the first insulating parts 31 and to suppress the breakdown voltage of the semiconductor device 100 from decreasing, the distance D1 is desired to be not more than the distance D2. The distance D1 is more preferably to be less than the distance D2. Thereby, the n⁻-type semiconductor region 1 between the first insulating parts 31 is more easily depleted, and the breakdown voltage of the semiconductor device 100 can be suppressed from decreasing.

A distance D3 in the Y-direction between the first insulating part 31 and the second insulating part 32 is desired to be the same as the distance D2 or to be shorter than the distance D2. The distance D3 is, for example, the same as a length in the Y-direction of a portion between the first insulating part 31 and the second insulating part 32 of the n⁻-type semiconductor region 1. According to this configuration, the breakdown voltage of the semiconductor device 100 can be suppressed from decreasing as well as the above.

(Variation)

Figure 10:
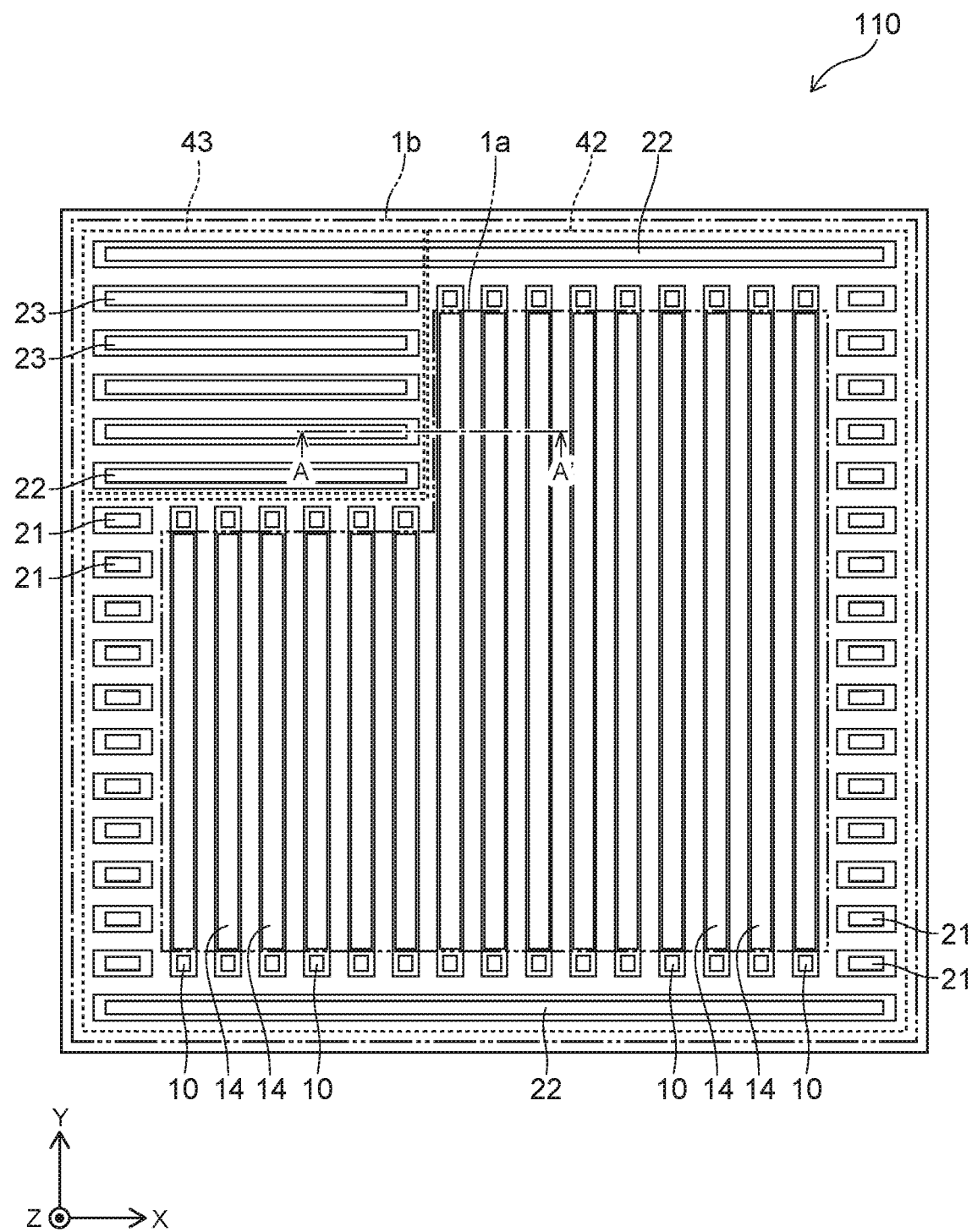
FIG. 10 is a plan view showing a semiconductor device according to a variation of the first embodiment.

FIG. 10 is a plan view showing a semiconductor device according to a variation of the first embodiment.

Figure 11:
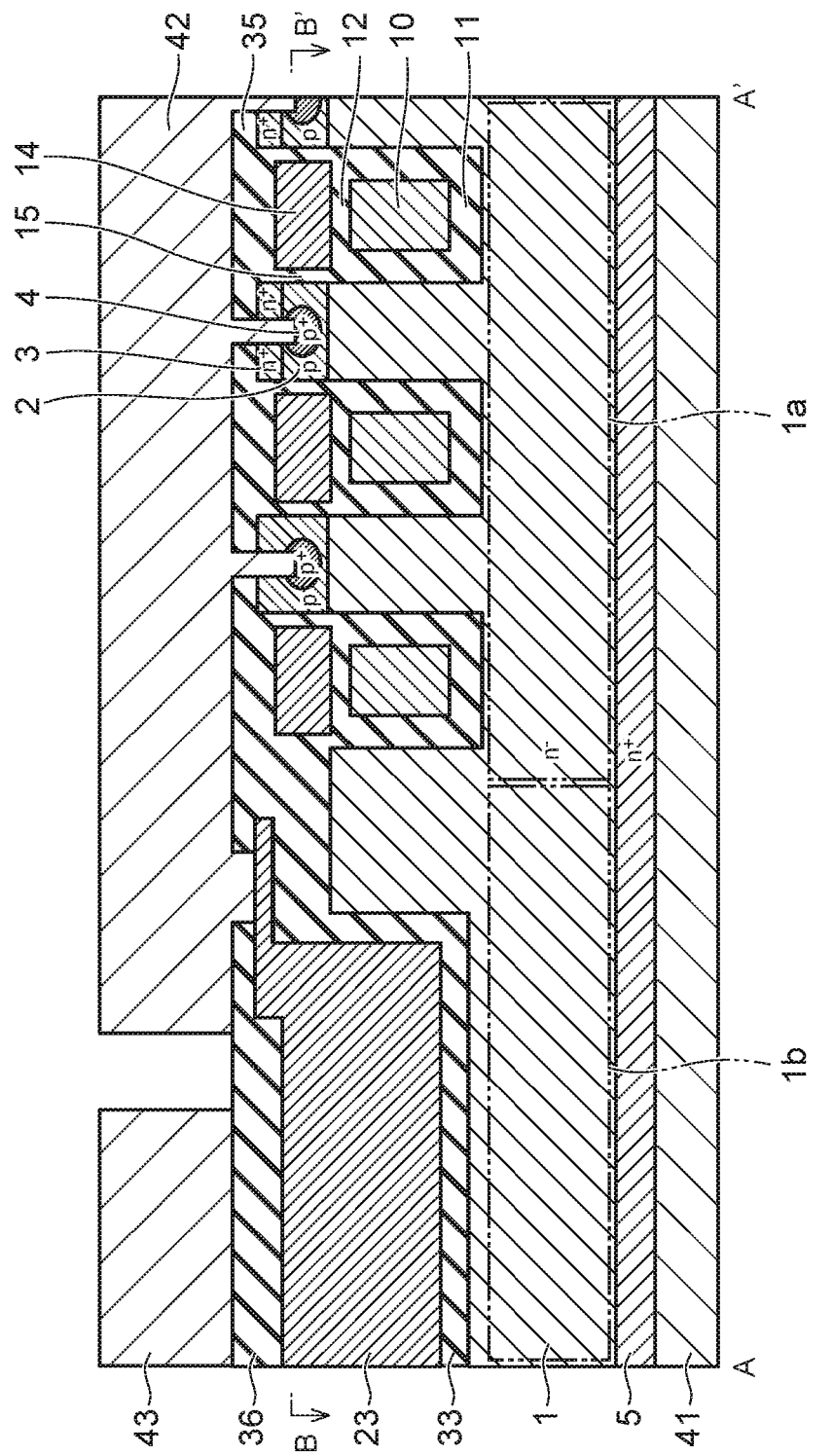
FIG. 11 is an A-A' cross-sectional view of FIG. 10.

FIG. 11 is an A-A' cross-sectional view of FIG. 10.

The plan view of FIG. 10 shows a cross section at a B-B' line of FIG. 11.

As shown in FIG. 10, a semiconductor device 110 according to the variation of the first embodiment further includes multiple third conductive parts 23. The multiple conductive parts 23 are separated in the Y-direction one another. The respective third conductive parts 23 extend in the X-direction. A portion of the respective third conductive parts 23 is positioned under the gate pad 43.

A portion of the gate electrode 14 is positioned in the X-direction between the multiple first conductive parts 21 and the multiple third conductive parts 23. A portion of the second conductive parts 22 is provided under the gate pad 43. The multiple third conductive parts 23 are positioned in the Y-direction between the first conductive parts 21 and the portion of the second conductive parts 22 and between the multiple gate electrodes 14 and another portion of the second conductive parts 22. A length in the X-direction of the third conductive parts 23 is longer than lengths in the X-direction of the respective gate electrodes 14 and the first conductive parts 21.

As shown in FIG. 11, the third conductive part 23 is provided on the second region 1b via the third insulating part 33. The third conductive part 23 opposes a portion of the n⁻-type semiconductor region 1 via the third insulating part 33 in the X-direction and the Y-direction. The gate pad 43 is provided on the third conductive part 23 via an insulating part 36. The third conductive part 23 is electrically connected to the source electrode 42. The third conductive part 23 may be electrically connected to the gate electrode 14 and the gate pad 43.

When a current flows in the diode of the semiconductor device 100, carriers are also stored in the n⁻-type semiconductor region 1 under the gate pad 43. Holes stored under the gate pad 43 flow to the p-type base region 2 close to the gate pad 43. Therefore, in the p-type base region 2 close to the gate pad 43, the potential is easy to rise, and the parasitic NPN transistor is more easily to operate.

As shown in FIG. 10, the multiple third conductive parts 23 are provided, and thus similar to the multiple first conductive parts 21, a portion of the holes h can be trapped when the holes h are discharged to the source electrode 42. Thereby, the operation of the parasitic NPN transistor near the gate pad 43 can be suppressed, and the possibility that the semiconductor device is destroyed can be further reduced.

Second Embodiment

Figure 12:
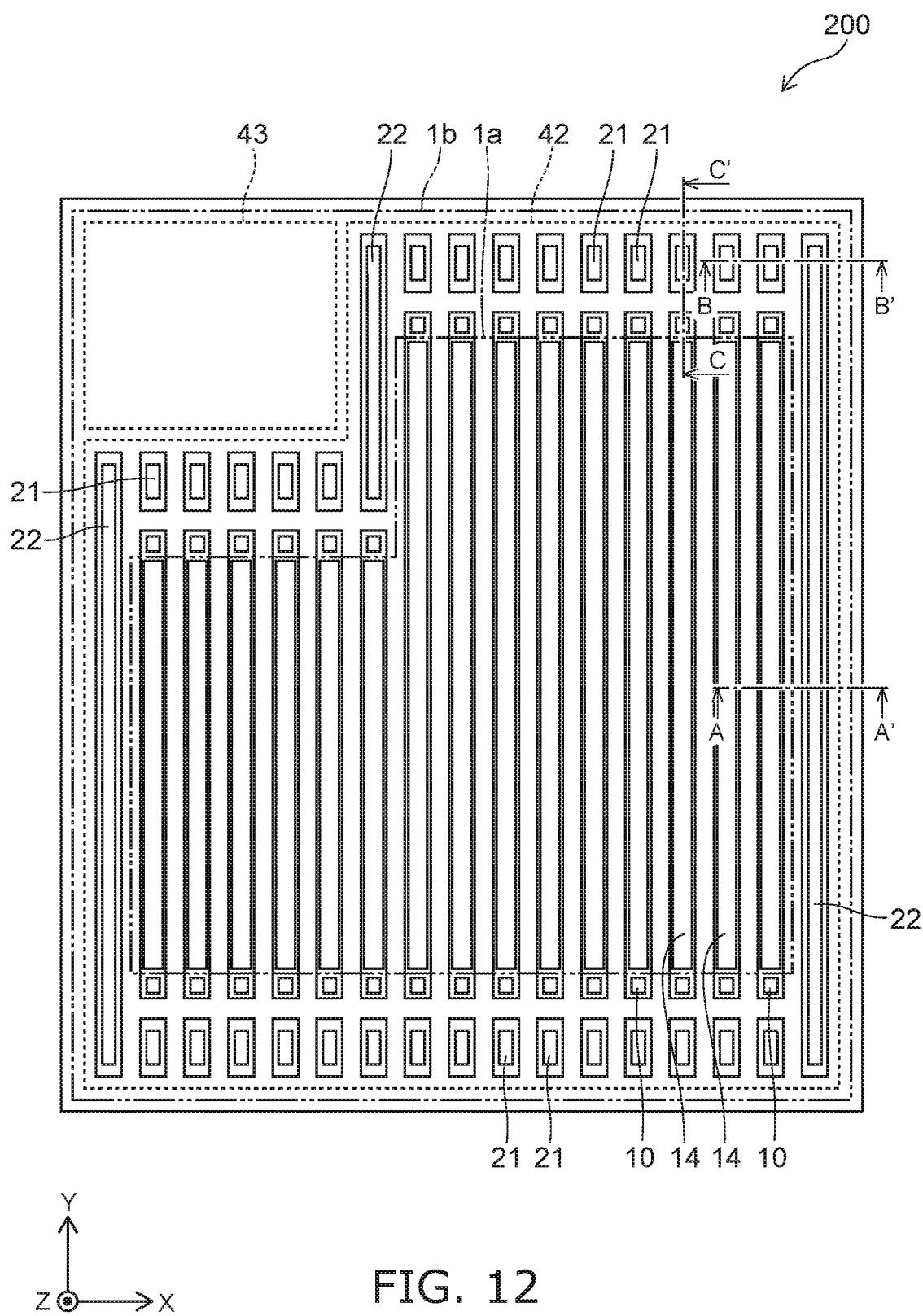
FIG. 12 is a plan view showing a semiconductor device according to a second embodiment.

FIG. 12 is a plan view showing a semiconductor device according to a second embodiment.

Figure 13A:
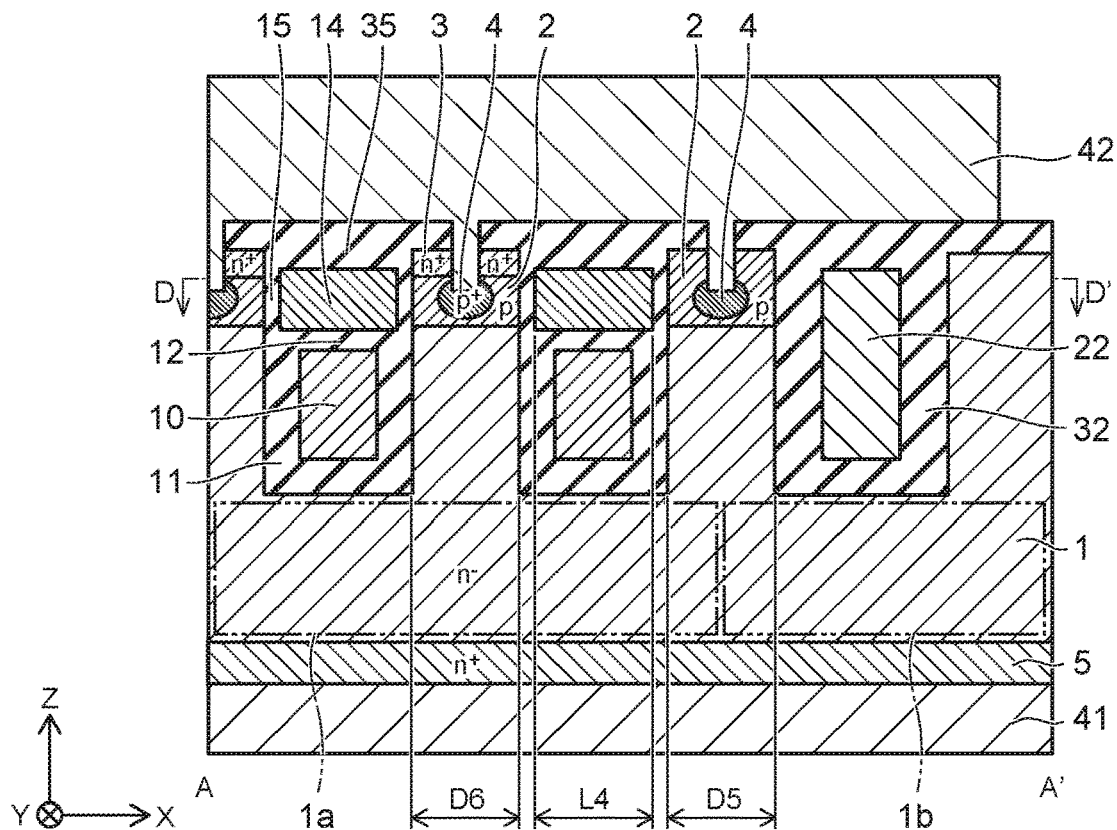
FIGS. 13A and 13B are an A-A' cross-sectional view and a B-B' cross-sectional view of FIG. 12.
Figure 13B:
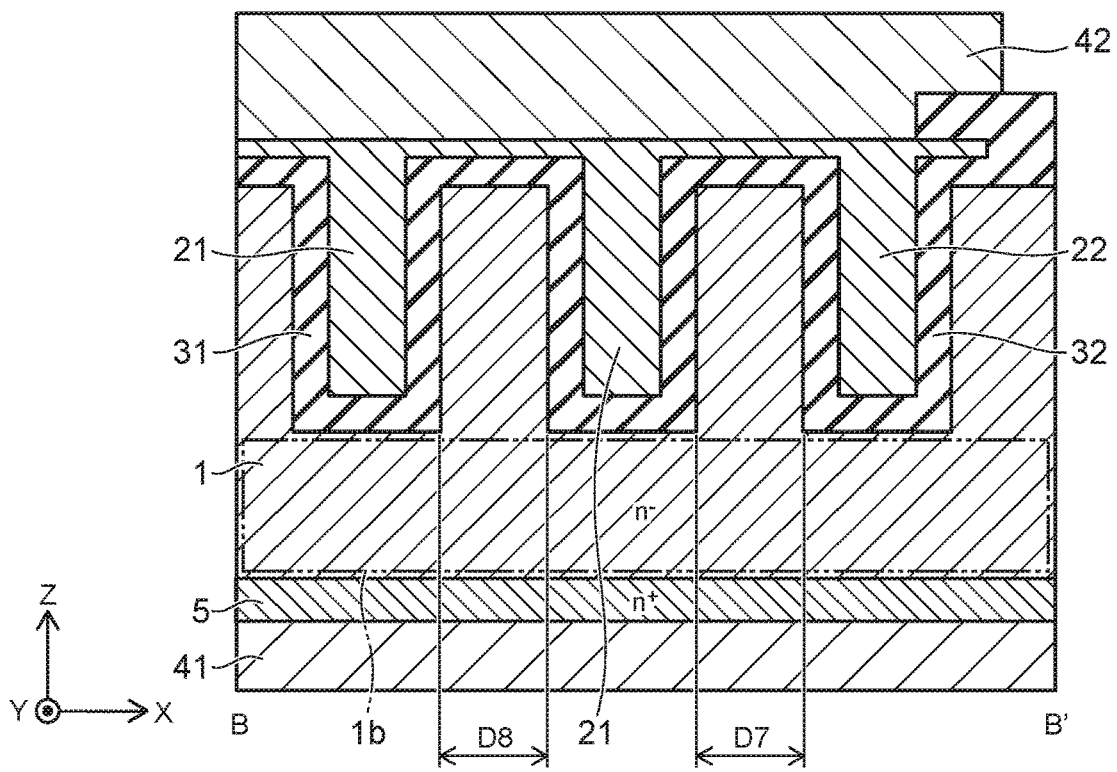

FIGS. 13A and 13B are an A-A' cross-sectional view and a B-B' cross-sectional view of FIG. 12.

Figure 14:
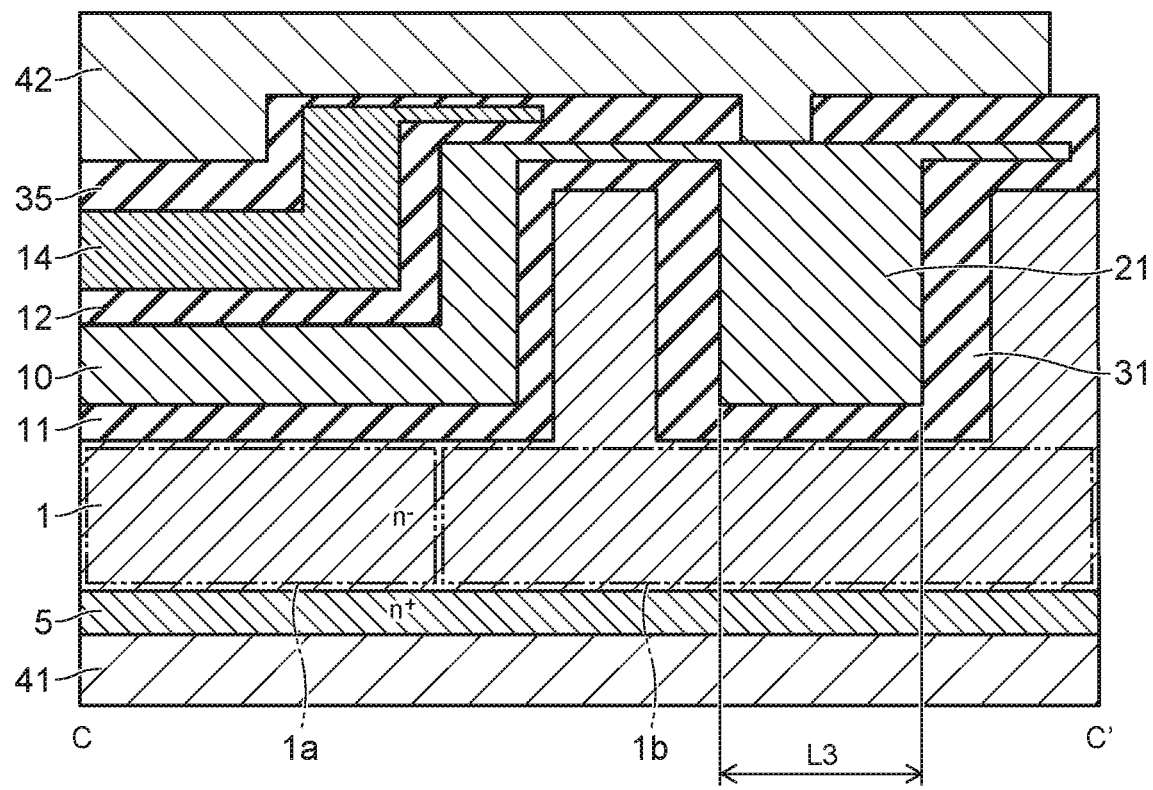
FIG. 14 is a C-C' cross-sectional view of FIG. 12.

FIG. 14 is a C-C' cross-sectional view of FIG. 12.

The plan view of FIG. 12 shows a cross section at a D-D' line of FIG. 13A.

In a semiconductor device 200 according to a second embodiment, as shown in FIG. 12, the multiple first conductive parts 21 are separated one another in the X-direction. The multiple first conductive parts 21 are arranged with the multiple gate electrodes 14 in the Y-direction. The second conductive parts 22 are arranged with the gate electrodes 14 and the first conductive parts 21 in the X-direction.

In the example shown in FIG. 12, the multiple gate electrodes 14 are positioned in the Y-direction between a portion of the multiple first conductive parts 21 and another portion of the multiple first conductive parts 21. At least a portion of the respective gate electrodes 14 is positioned between the second conductive part 22 and the other second conductive part 22.

As shown in FIG. 13A, for example, a distance D5 in the X-direction between the gate insulating part 15 and the second insulating part 32 is the same as a distance D6 between the gate insulating parts 15. For example, as shown in FIG. 13B, a distance D7 in the X-direction between the first insulating part 31 and the second insulating part 32 is the same as a distance D8 between the first insulating parts 31. Alternatively, the distance D8 is shorter than the distance D6. A length L3 (shown in FIG. 14) in the Y-direction of the first conductive part 21 is longer than a length L4 (shown in FIG. 13A) in the X-direction of the gate electrode 14.

Also in the embodiment, the multiple first conductive parts 21 are provided, and thus similar to the first embodiment, it is possible to increase variations in time until the holes h reach the p-type base region 2. Thereby, the $dI_R/dt$ in the reverse recovery operation can be small, and the possibility that the semiconductor device is destroyed by the operation of the parasitic NPN transistor can be reduced.

In the semiconductor device according to the second embodiment, similar to the semiconductor device 110, the multiple third conductive parts 23 may be provided under the gate pad 43. In such a case, the multiple third conductive parts 23 are separated one another in the X-direction. The multiple third conductive parts 23 are provided, and thus the operation of the parasitic NPN transistor near the gate pad 43 can be suppressed, and the possibility that the semiconductor device is destroyed can be further reduced.

In order to improve the breakdown voltage, the multiple first conductive parts 21 are desired to be arranged in the Y-direction such as the semiconductor device 100. This point will be described with reference to FIGS. 15A to 15D.

FIGS. 15A to 15D are plan views showing a portion of the semiconductor device according to the first embodiment and a portion of the semiconductor device according to the second embodiment.

In the examples shown in FIGS. 15A to 15D, a distance between the insulating parts 11, a distance between the first insulating parts 31, a distance between the insulating part 11 and the first insulating part 31, a distance between the insulating part 11 and the second insulating part 32, and a distance between the first insulating part 31 and the second insulating part 32 are the same one another.

Figure 15A:
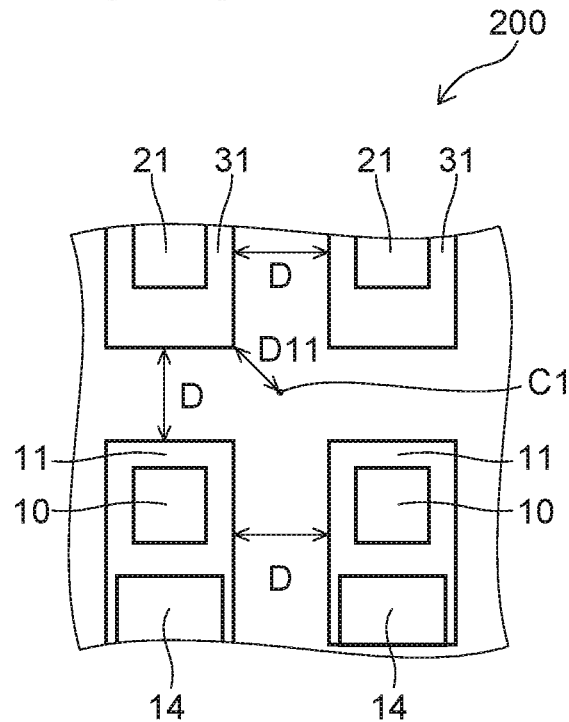
FIGS. 15A to 15D are plan views showing a portion of the semiconductor device according to the first embodiment and plan views showing a portion of the semiconductor device according to the second embodiment.
Figure 15B:
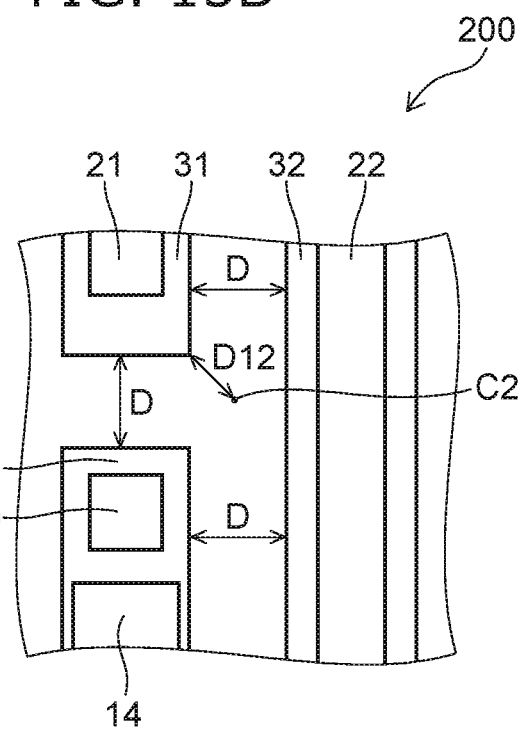

FIG. 15A shows the vicinity of an end portion of the semiconductor device 200 in the Y-direction. FIG. 15B shows the vicinity of an end portion in the X-direction of the semiconductor device 200. As shown in FIG. 15A, a distance D11 is $1/\sqrt{2}$ times of the distance D. The distance D11 is a distance between the respective insulating parts and a center point C1 among one pair of first insulating parts 31 and one pair of insulating parts 11. The distance D is a distance between the insulating parts 11.

On the other hand, as shown in FIG. 15B, a distance D12 is $1/\sqrt{3}$ times of the distance D. The distance D12 is a distance between the respective insulating parts and a center point C2 among the insulating part 11, the first insulating part 31, and the second insulating part 32.

That is, the distance D11 is different from the distance D12, and longer than the distance D12. A difference between the distance D11 and the distance D is larger than a difference between the distance D12 and the distance D. If differences of these distances are large, variations are generated in spreading of the depletion layer, and the breakdown voltage of the semiconductor device may decrease.

Figure 15C:
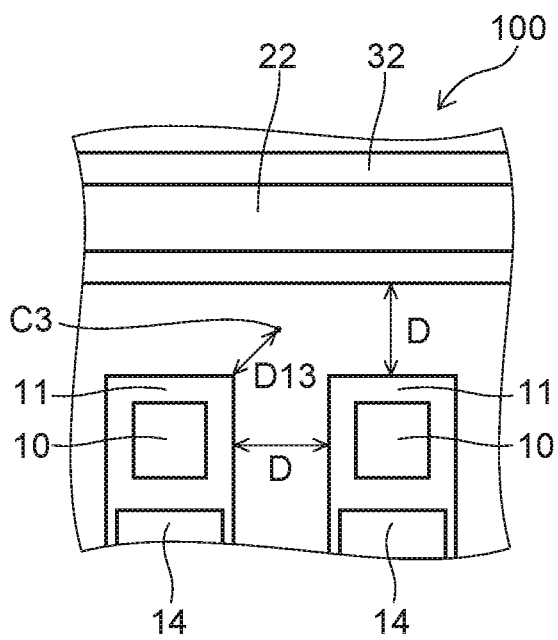
Figure 15D:
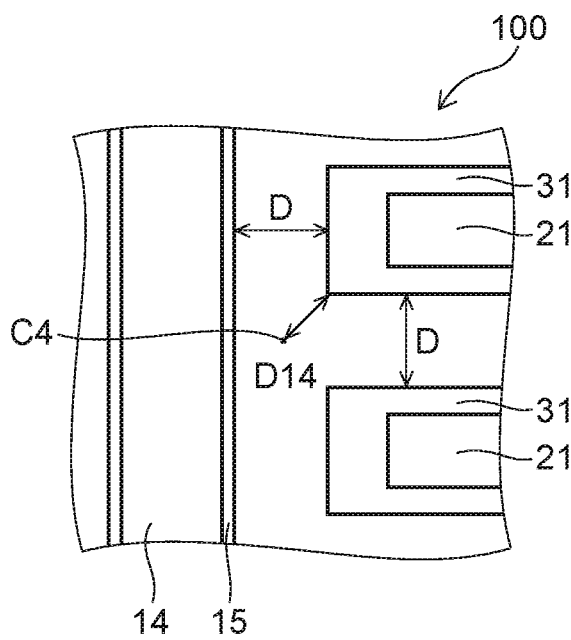

FIG. 15C shows the vicinity of an end portion of the semiconductor device 100 in the Y-direction. FIG. 15D shows the vicinity of an end portion of the semiconductor device 100 in the X-direction. As shown in FIG. 15C, a distance D13 is $1/\sqrt{3}$ times of the distance D. The distance D13 is a distance between the respective insulating parts and a center point C3 among one pair of first insulating parts 11 and the second insulating part 32.

As shown in FIG. 15D, a distance D14 is $1/\sqrt{3}$ times of the distance D between the insulating parts 11. The distance D14 is a distance between the respective insulating parts and a center point C4 among the gate insulating layer 15 and one pair of first insulating parts 31.

That is, the distance D13 is the same as the distance D14. In comparison with the semiconductor device 200, a difference between the distance D and each of the distance D13 and the distance D14 is smaller than the difference between the distance D11 and the distance D.

Because of this, in the semiconductor device 100, a difference between spreading of the depletion layer in the vicinity of the first insulating part 31 and spreading of the depletion layer in the vicinity of the second insulating part 32 can be small. Therefore, even if the multiple first conductive parts 21 are separated one another, the breakdown voltage can be suppressed from decreasing.

Third Embodiment

Figure 16:
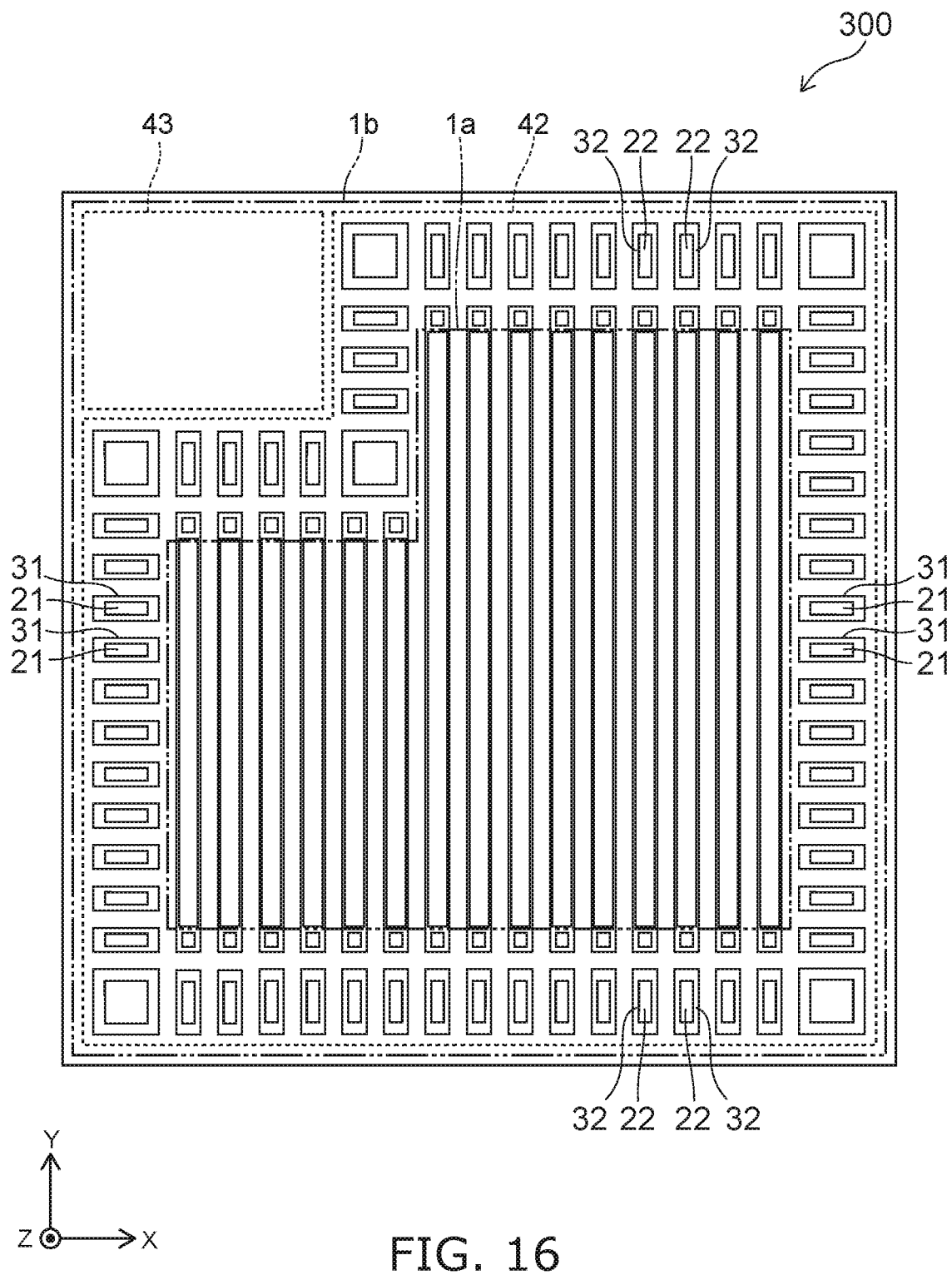
FIG. 16 is a plan view showing a semiconductor device according to a third embodiment.

FIG. 16 is a plan view showing a semiconductor device according to a third embodiment.

In a semiconductor device 300 according to a third embodiment, the multiple first conductive parts 21 are arranged with the gate electrodes 14 in the X-direction. The multiple first conductive parts 21 are separated in the Y-direction one another. The multiple second conductive parts 22 are arranged with the multiple gate electrodes 14 in the Y-direction. The multiple second conductive parts 22 are separated in the X-direction one another.

In the example shown in FIG. 16, the multiple gate electrodes 14 are positioned in the X-direction between a portion of the multiple first conductive parts 21 and another portion of the multiple first conductive parts 21. The multiple gate electrodes 14 are positioned in the Y-direction between a portion of the multiple second conductive parts 22 and another portion of the multiple second conductive parts 22.

The multiple first conductive parts 21 and the multiple second conductive parts 22 are provided, and thus it is possible to increase variations in time until the holes h arrives at the p-type base region 2 in a broader range of the outer circumferential part of the $n^-$-type semiconductor region 1. Thereby, the possibility that the semiconductor device is destroyed by the operation of the parasitic NPN transistor can be further reduced.

In the embodiments described above, relative high and low concentrations of impurities between the respective semiconductor regions are possible to be confirmed by using SCM (Scanning Electrostatic Capacitance Microscopy). Carrier concentrations in the respective semiconductor regions can be regarded to be equal to the activated impurity concentrations in the respective semiconductor regions. Therefore, relative high and low concentrations of carriers between the respective semiconductor regions are also possible to be confirmed by using SCM (Scanning Electrostatic Capacitance Microscopy).

Impurity concentrations in the respective semiconductor regions are possible to be measured, for example, by SIMS (Secondary Ion Mass Spectroscopy).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention,

What is claimed is:

1. A semiconductor device, comprising:
   a first electrode;
   a first semiconductor region provided on the first electrode, the first semiconductor region including a first region and a second region arranged along the first electrode, the second region surrounding the first region, the first semiconductor region being of a first conductivity type;
   a second semiconductor region provided selectively on the first region of the first semiconductor region, the second semiconductor region being of a second conductivity type;
   a third semiconductor region provided on the second semiconductor region, the third semiconductor region of the first conductivity type, the first to third semiconductor regions being arranged in a first direction perpendicular to the first electrode;

a second electrode provided on the third semiconductor region, the second electrode being electrically connected to the second semiconductor region and the third semiconductor region;

a gate electrode provided selectively on the first region of the first semiconductor region, the gate electrode opposing the second semiconductor region via a gate insulating part in a second direction perpendicular to the first direction; and a plurality of conductive parts provided in the second region of the first semiconductor region, the plurality of conductive parts provided around the second semiconductor region and the gate electrode, the plurality of conductive parts being separated from each other, the plurality of conductive parts being electrically connected to the second electrode or the gate electrode, the plurality of conductive parts including a plurality of first conductive parts and a plurality of second conductive parts, the plurality of first conductive parts being arranged along the second semiconductor region in a third direction perpendicular to the first and second directions, the plurality of first conductive parts being electrically isolated from the first and second semiconductor regions by a first insulating part, the plurality of second conductive parts and the gate electrode being arranged in the third direction, the gate electrode being provided between the adjacent second conductive parts of the plurality of second conductive parts in the third direction, the plurality of second conductive parts being electrically isolated from the first semiconductor region by a second insulating part.

2. The device according to claim 1, wherein one of the plurality of first conductive parts has a length in the second direction, the length of the one of the plurality of first conductive parts being longer than a length of the gate electrode in the second direction.

3. The device according to claim 1, wherein
the gate electrode includes a plurality of parts arranged in the second direction, the plurality of parts being separated from each other;
the second semiconductor region including a portion between the adjacent parts of the gate electrode, the portion of the second semiconductor region having a width in the second direction between the adjacent parts of the gate electrode; and
the first semiconductor region including a portion between the adjacent first conductive parts of the plurality of first conductive parts arranged in the third direction, the portion of the first semiconductor region having a width in the third direction, the width of the portion of the first semiconductor region being not more than the width of the portion of the second semiconductor region in the second direction.

4. The device according to claim 1, further comprising:
a third electrode provided above the second region of the first semiconductor region, the third electrode being separated from the second electrode, the third electrode being electrically connected to the gate electrode, wherein
the plurality of conductive parts further includes a third conductive part provided between the third electrode and the second region of the first semiconductor region, the third conductive part being electrically isolated from the first semiconductor region by a third insulating part.

5. The device according to claim 4, wherein
the plurality of first conductive parts each has a first length in the second direction, and the third conductive part has a third length in the second direction, the first length being shorter than the third length.

6. The device according to claim 1, further comprising:
a conductive plate provided in the first insulating part, the conductive plate being provided between the second semiconductor region and each of the plurality of first conductive parts, the conductive plate being electrically isolated from the first semiconductor region, the second semiconductor region and each of the plurality of first conductive parts by the first insulating part.

7. The device according to claim 1, wherein
the plurality of first conductive parts includes a first line arrangement of first conductive parts in the third direction and a second line arrangement of first conductive parts in the third direction, and
the gate electrode is provided between the first line arrangement of first conductive parts and the second line arrangement of first conductive parts.

8. The device according to claim 1, wherein
the plurality of second conductive parts includes a first second conductive part and a second second conductive part; and
the gate electrode and the second semiconductor region are provided between the first second conductive part and the second second conductive part.

9. The device according to claim 1, further comprising:
a fourth semiconductor region provided on the second semiconductor region,
the fourth semiconductor region being of the second conductivity type,
an impurity concentration of the second conductivity type in the fourth semiconductor region is higher than an impurity concentration of the second conductivity type in the second semiconductor region.

10. The device according to claim 1, further comprising:
a fifth semiconductor region provided between the first electrode and the first semiconductor region and electrically connected to the first electrode,
the fifth semiconductor region being of the first conductivity type,
an impurity concentration of the first conductivity type in the fifth semiconductor region is higher than an impurity concentration of the first conductivity type in the first semiconductor region.

* * * * *